(12) United States Patent
Choi et al.

(10) Patent No.: US 8,033,184 B2
(45) Date of Patent: Oct. 11, 2011

(54) QUANTUM-BASED FORCE REALIZATION APPARATUS AND FORCE MEASURER USING THE SAME

(75) Inventors: Jae-hyuk Choi, Daejeon (KR); Min-seok Kim, Daejeon (KR); Yon-kyu Park, Daejeon (KR); Kwang-cheol Lee, Daejeon (KR); Mahn-soo Choi, Uijeongbu-si (KR)

(73) Assignee: Korea Research Institute of Standards and Science (KR)

( * ) Notice: Subject to any disclaimer, the term of this patent is extended or adjusted under 35 U.S.C. 154(b) by 361 days.

(21) Appl. No.: 11/696,264

(22) Filed: Apr. 4, 2007

(65) Prior Publication Data

US 2008/0047367 A1 Feb. 28, 2008

(30) Foreign Application Priority Data

Aug. 25, 2006 (KR) .................. 10-2006-0081273

(51) Int. Cl.
*G01L 1/04* (2006.01)
(52) U.S. Cl. ........................... 73/862.639; 73/862.637
(58) Field of Classification Search ... 73/862.59–862.69
See application file for complete search history.

(56) References Cited

FOREIGN PATENT DOCUMENTS

JP 64-080899 3/1989

*Primary Examiner* — Edward Johnson
(74) *Attorney, Agent, or Firm* — Cantor Colburn LLP

(57) ABSTRACT

Disclosed herein are a force realization apparatus using a superconducting flux quantum, which is capable of generating force proportional to a flux quantum number by including a micron-sized superconducting annulus or superconducting quantum interference device in an ultra-sensitive cantilever, and a force measurer using the same.

7 Claims, 1 Drawing Sheet

QUANTUM-BASED FORCE REALIZATION APPARATUS AND FORCE MEASURER USING THE SAME

BACKGROUND OF THE INVENTION

1. Field of the Invention

The present invention relates to a standard force realization apparatus, and more particularly to a standard force realization apparatus using a superconducting flux quantum, which is capable of generating force proportional to a flux quantum number by including a micron-sized superconducting annulus or superconducting quantum interference device in an ultra-sensitive cantilever.

2. Description of the Related Art

As industries have been remarkably developed, precision of measurement standard has been of importance. Force measurement is widely performed from the aerospace industry, the heavy chemical industry and the plant industry which treat a load of at least several tens of mega-Newtons (MN) to the ultra-precision weighing machine field which measures a weight of several tens or less of micrograms and an atomic force microscope which senses nano-Newtons (nN). Every country uses a deadweight force standard machine, which is developed by a national measurement institute, as a national standard mainly in the 5 N~500 kN range.

A force realization apparatus is used in the force standard machine, which provides force generated by a weight to a force measurer and checks how precise the force measurer is.

Recently, due to remarkable improvement in measurement sensitivity, force measurement has become a useful and essential probe for leading-edge nano/bio-researches, which cover protein folding studies, high-integration data storage, nanoscale imaging, non-Newtonian gravitation measurement, and many others.

The force detection limit keeps getting lowered, for example, to an atto-Newton ($10^{-18}$ N) (aN) level in magnetic resonance force microscopy capable of reading a single electron spin.

However, no direct system international (SI)-traceable force realization has been established even at below 1 Newton level. The prevailing deadweight method, which creates gravitational force using standard weights, obviously becomes no longer valid below micro-Newton level. In the national institute of standards and technology of United States of America, a microforce realization and measurement project for generating force of 10 micro-Newtons or less using an electrical method has been proposed. Therein, the force is created between two electrodes of a capacitor having a constant voltage and is represented by electrical units such as a voltage. The electrical units are traced to their standards based on Josephson and quantized Hall effects.

However, at the nano-Newton or pico-Newton level, no force realization method for standard has been suggested despite needs for precision measurements of force. In addition, it casts a striking contrast to the case of the electrical units such as the voltage that no attempt has been tried to directly use quantum phenomena in realizing a mechanical force.

SUMMARY OF THE INVENTION

Therefore, the present invention has been made in view of the above problems, and it is an object of the present invention to provide a novel quantum-based force realization apparatus utilizing a macroscopic quantum phenomenon known as magnetic flux quantization in a superconducting annulus.

It is another object of the present invention to provide a force realization apparatus for increasing or decreasing force by an integral multiple of unit force having a constant value through variation in a flux quantum number, in which the unit force is estimated to be sub-pico-Newton level, the flux quantum serves as a weight having the sub-pico-Newton level and is SI-traceable, and the levels of the forces are quantum-mechanically uniform.

In accordance with an aspect of the present invention, the above and other objects can be accomplished by the provision of a quantum-based force realization apparatus comprising: superconducting quantum trap means having a magnetic moment proportional to a flux quantum number; an ultra-sensitive cantilever which mounts therein the superconducting quantum trap means, has elasticity and is displaced by force generated by the superconducting quantum trap means located in a magnetic field gradient; and a magnetic field generator which applies a magnetic field to the superconducting quantum trap means.

According to another aspect of the present invention, there is provided a quantum-based force measurer comprising: superconducting quantum trap means having a magnetic moment proportional to a flux quantum number; an ultra-sensitive cantilever which mounts therein the superconducting quantum trap means, has elasticity and is displaced by force generated by the superconducting quantum trap means located in a magnetic field gradient; a magnetic field generator which applies a magnetic field to the superconducting quantum trap means; an optical fiber interferometer which senses the displacement of the cantilever; and a computer which controls the superconducting quantum trap means, the ultra-sensitive cantilever and magnetic field generator and calculates the force from obtained data.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
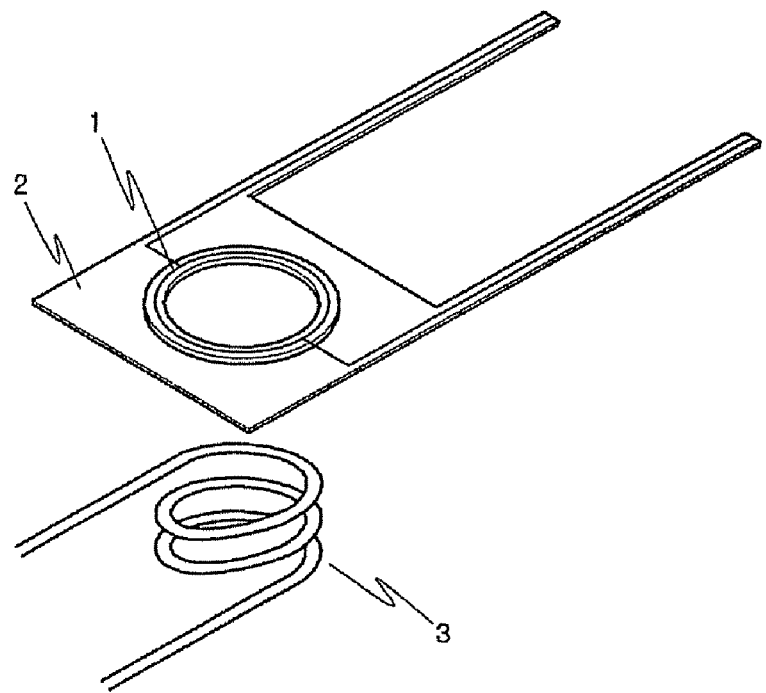
FIG. 1 is a perspective view showing a quantum-based force realization apparatus according to the present invention.
Figure 2:
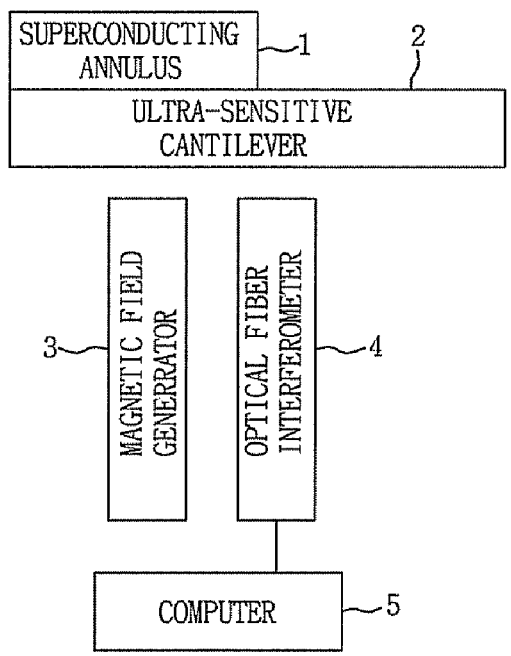
FIG. 2 is a view showing the configuration of a force measurer using the quantum-based force realization apparatus according to the present invention.

FIG. 1 is a perspective view showing a quantum-based force realization apparatus according to the present invention and FIG. 2 is a view showing the configuration of a force measurer using the quantum-based force realization apparatus according to the present invention.

As shown in FIG. 1, the force realization apparatus according to the present invention includes superconducting quantum trap means 1, an ultra-sensitive cantilever 2 in which the superconducting quantum trap means 1 is mounted, and a magnetic field generator 3 for applying a magnetic field to the superconducting quantum trap means 1.

The superconducting quantum trap means 1 may include a micro-sized superconducting annulus or superconducting quantum interference device (SQUID), as shown in FIG. 1. In the present invention, the superconducting annulus will be, for example, described.

The superconducting annulus 1 is made of a material such as niobium (Nb) or aluminum (Al), which is a low-temperature superconductor. A quantization phenomenon, in which magnetic flux passing through the superconducting annulus 1 below a critical temperature has a discontinuous value, occurs and the resultant magnetic moment is proportional to an integral multiple of a specific value. When the superconducting annulus 1 having the magnetic moment is located in a magnetic field gradient, force is generated to displace the ultra-sensitivity cantilever 2.

Although niobium (Nb) and aluminum (Al) are described as the superconducting material, it is apparent that any one of a variety of superconducting materials, which is not described in this specification, may be selected in the related art.

The magnetic field generator 3 is provided as means for applying a magnetic field to the superconducting annulus 1 and may be formed of a general magnet or a superconducting coil magnet.

The generated force is adjusted by changing a flux quantum number.

A quantum-based force measurer is implemented using the above-described force realization apparatus. The quantum-based force measurer includes the above-described force realization apparatus, an optical fiber interferometer 4 for sensing the displacement of the ultra-sensitive cantilever 2 and a computer 5 for controlling the components and calculating force from obtained data.

That is, the superconducting annulus 1 traps the quantized magnetic fluxoid from the magnetic field generator 3 to generate in magnetic field gradient the force which displaces the ultra-sensitive cantilever 2. Then, the optical fiber interferometer 4 measures the displacement of the ultra-sensitive cantilever 2 and the computer 5 converts the displacement into force.

Hereinafter, a process of generating the force using the quantum-based force realization apparatus will be described.

First, the force is obtained by a product of the magnetic moment and the magnetic field gradient. The process of obtaining the magnetic moment is as follows.

The level of the magnetic flux quantized by the superconducting annulus 1 is $$\Phi = n\phi_0 = nh/2e.$$

where, n is the magnetic quantum number having a positive integer and the flux unit quantum $\phi_0$ is determined by Planck's constant h, which is a basic constant, and an electronic charge e.

Using an inductance approximate value $L=2\mu_0 R$ of the superconducting annulus and the magnetic moment $m=I_s \pi R^2$ of the supercurrent $I_s$, the magnetic moment of the flux quantum is expressed by $$m_Q = \frac{\pi}{2\mu_0}\frac{h}{2e}R,$$

where, $\mu = 4\pi \times 10^{-7}$ and R is the radius of the superconducting annulus.

A more accurate value may be obtained by obtaining a three-dimensional current distribution in the superconducting annulus and performing integration by $$m_Q = \pi \int_a^b dr r^2 J(r),$$

where, a and b are inner and outer radii of the superconducting annulus, respectively, and J(r) is a current density distribution of a space which is separated from the center of the superconducting annulus by r. The current density distribution J(r) can be obtained using the Ginzburg-Landau equation and the Maxwell electromagnetic equation. As a result, the magnetic moment is expressed by $$m_Q = \frac{\pi}{2\mu_0}\frac{h}{2e} b \times g(a, b, \Lambda),$$

where, a function $g(a, b, \Lambda)$ is determined by lengths a and b and a penetration depth $\Lambda$ in the current density distribution and can be generally obtained by numerical calculation.

Accordingly, the quantum force is $$F = nm_Q\frac{dB}{dz} = n\frac{\pi}{2\mu_0}\frac{h}{2e} b \frac{dB}{dz} \times g(a, b, \Lambda)$$

and is determined by the basic constants h and e, the length and the magnetic field gradient.

For example, when the inner and outer radii of the superconducting annulus made of: niobium (Nb) are respectively 5 μm and 10 μm, the thickness of the superconducting annulus is 50 nm, and the magnetic field gradient is 10 T/m, the magnetic moment according to the unit quantum number is $$m_Q = 1.116\frac{\phi_0 b}{\mu_0} = 1.65 \times 10^{-14} \text{ A}\cdot\text{m}^2$$

and the unit force is $$F_Q = m_Q\frac{dB}{dz} = 184 \times 10^{-15} \text{ N}.$$

A maximum limit of the force generated by the flux quantum is $$F_{max} = I_c \pi \left(\frac{a+b}{2}\right)^2 \frac{dB}{dz} = 40 \times 10^{-12} \text{ N}$$

where, $I_c$ is critical current of the superconducting material and a density value of the critical current of niobium is used in the equation.

Although the force generated by the unit flux quantum is calculated, the total magnetic moment $m_{total}$ may vary depending on an external magnetic field $B_{ext}$ as well as the number of the flux quantum n, as expressed by $$m_{total} = nm_Q + xB_{ext}$$

Accordingly, in order to precisely generate desired force, a special procedure for extracting a force component of the flux quantum is required.

The suggested procedure is as follows: First, the magnetic field $B_{ext}$ gradually increases from an initial state (n=0), in which $B_{ext}=0$ and a temperature is below a transition temperature, to allow a desired number n of flux quantums to pass through the superconducting annulus. At this time, when the temperature increases to the transition temperature or more and then decreases and the magnetic field is removed, n flux quantums remain in a final state having $B_{ext}=0$. Since the external magnetic field of the final state is equal to that of the initial state, only the force is generated by n flux quantums. When a difference (Dz) in the displacement of the ultra-sensitive cantilever before and after the procedure is measured, a spring constant of the cantilever can be corrected using the standard force by $k=F/\Delta z$.

Since this procedure is efficient when the initial magnetic field and the final magnetic field are equal to each other, the procedure is applicable to even a case where the external magnetic field is not accurately 0 due to a background magnetic field.

As described above, according to the present invention, it is possible to generate fine force based on quantum, to precisely control the force in the quantum unit, and to provide standard force in a pico-Newton level.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A quantum-based force realization apparatus comprising:
   superconducting quantum trap means having a magnetic moment proportional to a flux quantum number;
   an ultra-sensitive cantilever which mounts therein the superconducting quantum trap means, has elasticity and is displaced by force generated by the superconducting quantum trap means located in a magnetic field gradient; and
   a magnetic field generator which applies a magnetic field to the superconducting quantum trap means.

2. The quantum-based force realization apparatus as set forth in claim 1, wherein the superconducting quantum trap means is formed of a low-temperature superconductor such as niobium (Nb) and aluminum (Al).

3. The quantum-based force realization apparatus as set forth in claim 1, wherein the superconducting quantum trap means is a superconducting quantum interference device.

4. The quantum-based force realization apparatus as set forth in claim 2, wherein the superconducting quantum trap means is a superconducting quantum interference device.

5. The quantum-based force realization apparatus as set forth in claim 1, wherein the superconducting quantum trap means is a superconducting annulus.

6. The quantum-based force realization apparatus as set forth in claim 2, wherein the superconducting quantum trap means is a superconducting annulus.

7. A quantum-based force measurer comprising:
   superconducting quantum trap means having a magnetic moment proportional to a flux quantum number;
   an ultra-sensitive cantilever which mounts therein the superconducting quantum trap means, has elasticity and is displaced by force generated by the superconducting quantum trap means located in a magnetic field gradient;
   a magnetic field generator which applies a magnetic field to the superconducting quantum trap means;
   an optical fiber interferometer which senses the displacement of the cantilever; and
   a computer which controls the superconducting quantum trap means, the ultra-sensitive cantilever and magnetic field generator and calculates the force from obtained data.

* * * * *